United States Patent [19]

Kagawa et al.

[11] Patent Number: 4,951,116
[45] Date of Patent: Aug. 21, 1990

[54] READ-ONLY MEMORY WITH IDENTIFICATION PATTERN

[75] Inventors: Takayoshi Kagawa, Nara; Suehiro Ishikura, Fukuyama, both of Japan

[73] Assignee: Sharp Kabushiki Kaisha, Osaka, Japan

[21] Appl. No.: 467,334

[22] Filed: Jan. 19, 1990

Related U.S. Application Data

[63] Continuation of Ser. No. 240,393, Aug. 29, 1988, abandoned, which is a continuation of Ser. No. 830,541, Feb. 18, 1986, abandoned.

[30] Foreign Application Priority Data

Mar. 6, 1985 [JP] Japan ................................ 60-45334

[51] Int. Cl.⁵ .......................................... H01L 27/12
[52] U.S. Cl. .......................................... 357/49; 357/59
[58] Field of Search ............... 437/924; 357/49, 59 G; 365/103, 104, 105

[56] References Cited

U.S. PATENT DOCUMENTS

| | | | |
|---|---|---|---|
| Re. 31,506 | 1/1984 | Ogiue et al. ...................... | 357/49 X |
| 4,012,762 | 3/1977 | Abe et al. ...................... | 357/23.15 X |
| 4,199,380 | 4/1980 | Farrell et al. ...................... | 357/49 X |
| 4,233,091 | 11/1980 | Kawabe ...................... | 437/924 |
| 4,353,086 | 10/1982 | Jaccodine et al. ............... | 357/49 X |
| 4,498,227 | 2/1985 | Howell et al. ...................... | 357/49 X |

OTHER PUBLICATIONS

Clark, K. G., "Automatic Mask Alignment in MOS/LSI Processing", Microelectronics, vol. 3, No. 9, pp. 47-55 (1970).

Ghandhi, *VLSI Fabrication Principles*, pp. 544-546, John Wiley, 1983.

Carr, W. N., et al., *MOS/LSI Design and Application*, McGraw-Hill, 1972, pp. 308-309.

Primary Examiner—Andrew J. James
Assistant Examiner—Sara W. Crane
Attorney, Agent, or Firm—Flehr, Hohbach, Test, Albritton & Herbert

[57] ABSTRACT

A semiconductor device of this invention such as a read-only memory has element areas on the substrate surface surrounded by a field SiO₂ layer with its surface etched according to a pattern so that the type of the chip can be identified easily by visual inspection.

4 Claims, 1 Drawing Sheet

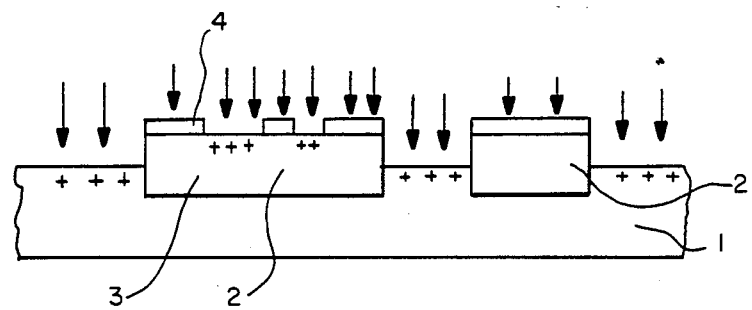
FIG. — 1
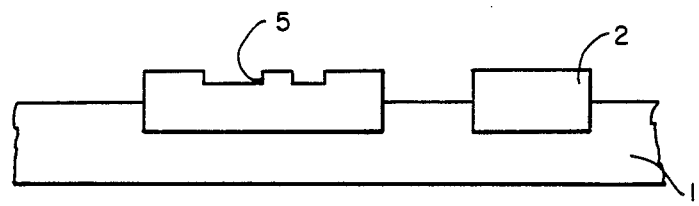
FIG. — 2
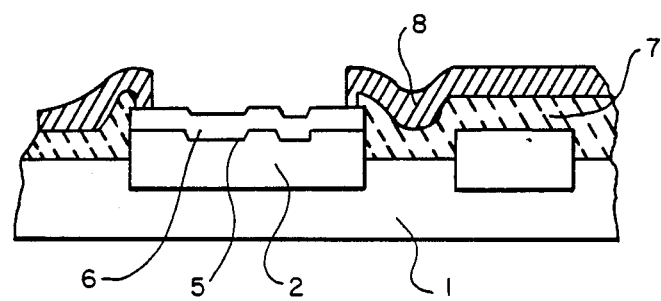
FIG. — 3

READ-ONLY MEMORY WITH IDENTIFICATION PATTERN

This is a continuation of application Ser. No. 240,393 filed Aug. 29, 1988, to be abandoned, which is a continuation of application Ser. No. 830,541 filed Feb. 18, 1986, now abandoned.

This invention relates to a semiconductor device such as a read-only memory of the type into which data are written by ion implantation and more particularly to such a semiconductor device of which the element areas are separated by a field SiO$_2$ layer with unevenness formed by etching on its surface to provide a pattern for chip identification.

Data of various types are written into read-only memories (ROM) in one of the steps during their production process. Such data may be written in by selecting diffusion areas, by determining whether wiring should be effected or not, or by selectively implanting impurity ions. When data are written in by a diffusion method or a contact method, surface deformations are involved and the chips with different data written in can easily be distinguished by visually inspecting the patterns formed on their surfaces. If an ion implantation method is used to write in data, however, no deformations appear on the chip surface and it is difficult to make distinctions among different chips by visual inspection alone. For this reason, special care must be taken to reduce sorting errors and an additional process for correct identification may be considered necessary. If this is to be done by checking the performance characteristics of the products, it can be carried out only after the completion of all production steps.

It is therefore an object of the present invention to provide semiconductor devices such as read-only memories which can be distinguished easily among different types.

The above and other objects of this invention are achieved by providing a semiconductor device such as a read-only memory having element areas mutually separated by a field SiO$_2$ layer with an identifying pattern created on its surface. Since such a pattern for chip identification may be formed in the step of implanting impurity ions and since such a step is already required for the fabrication of the semiconductor device, the chips can be made visually identifiable not necessarily at the end of but also during the fabrication process.

The accompanying drawings, which are incorporated in and form a part of the specification, illustrate a few embodiments of the present invention and, together with the description, serve to explain the principles of the invention. In the drawings:

FIG. 1 is a cross-sectional view of a silicon semiconductor substrate with which a ROM according to the present invention is fabricated;

FIG. 2 is a cross-sectional view of a semiconductor device according to one embodiment of the present invention; and FIG. 3 is a cross-sectional view of a semiconductor device according to another embodiment of the present invention.

In FIG. 1, numeral 1 indicates a silicon semiconductor substrate with which a ROM according to the present invention is fabricated. On the surface of the substrate 1 except the element areas, there is formed by thermal oxidation a field SiO$_2$ layer 2 which is thicker than the gate oxide layers. A surface area on the field SiO$_2$ on which no wiring is going to be provided in a later fabrication step is identified as the chip identification area and impurities 3 are introduced by ion implantation to the SiO$_2$ surface of this chip identification area in the same fabrication step of impurity ion implantation, for example, for the depletion of the element areas. In order to make the identification easier, it is preferable to assign different patterns to different types of chips and a mask 4 corresponding to a selected pattern is formed on the field SiO$_2$ layer 2 before the implantation of impurities. Thus, impurity ions are implanted through this mask 4.

Areas on the field SiO$_2$ layer 2 where ion implantation has taken place and areas where it has not have different etching speeds. Thus, indentations 5 as shown in FIG. 2 generally result when the ion-implanted substrate surface is exposed to an etching liquid. FIG. 2 shows a situation in which areas where impurity ions have been implanted have a larger etching speed. Such indentations 5 formed in a pattern can be easily recognized by visual observation of the field SiO$_2$ surface.

The production process for the semiconductor device may be continued with the SiO$_2$ surface exposed as the chip identification area as explained above. If the indentations 5 are shallow, however, there is the danger that the pattern may disappear or become illegible, for example, by a subsequent etching process. For this reason, a polysilicon layer 6 may be formed on the chip identification area as shown in FIG. 3 in the same fabrication step for the formation of the polysilicon layer to become the gate electrode of a MOSFET or the like. The polysilicon layer 6 has the effect of making the indentations 5 below on the field SiO$_2$ surface more clearly discernible.

A passivation layer 7 of phospho-silicate glass PSG and the like with a protective layer 8 thereabove is formed on the substrate surface by chemical vapor deposition in a subsequent fabrication step. Since the passivation layer 7 covering the field SiO$_2$ surface may make the identification pattern less easily legible, however, a contact etching process may be used to remove it as shown in FIG. 3.

In summary, the present invention makes it possible to easily identify the types of semiconductor chip merely by observing the patterns on the chips surfaces. With respect to devices like ROM chips produced by ion implantation which cannot be distinguished easily from their external appearance alone, the present invention is particularly useful because types of such devices can be made easily identifiable without adding an extra step in the fabrication process. The foregoing description of embodiments of the invention has been presented for purposes of illustration and description. It is not intended to be exhaustive or to limit the invention to the precise form disclosed, and obviously many modifications and variations are possible in light of the above teaching. Such modifications and variations which may be apparent to a person skilled in the art are to be considered within the scope of this invention.

What is claimed is:

1. A read-only memory into which data are written by ion implantation comprising
   a substrate having element areas thereon, and
   a field SiO$_2$ layer formed around said element areas on said substrate, said field SiO$_2$ layer having an ion-implanted surface area of a selected pattern, said pattern being indicative of the type of said memory, said surface area having unevenness formed thereon in a same fabrication process wherein said element areas are processed, said unevenness including indentations and protrusions in a visually distinguishable pattern to serve as an identification mark, said indentations and protrusions being covered by a polysilicon layer serving to make said identification mark more discernible.

2. The semiconductor device of claim 1 wherein said uneven surface is formed by etching.

3. The semiconductor device of claim 1 wherein said uneven surface is covered by a polysilicon layer.

4. The semiconductor device of claim 1 wherein said uneven surface is etched according to a predetermined pattern.

* * * * *